US008242979B2

(12) United States Patent
Anzai et al.

(10) Patent No.: US 8,242,979 B2
(45) Date of Patent: Aug. 14, 2012

(54) DISPLAY DEVICE

(75) Inventors: Aya Anzai, Kanagawa (JP); Mitsuaki Osame, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1024 days.

(21) Appl. No.: 11/734,580

(22) Filed: Apr. 12, 2007

(65) Prior Publication Data
US 2007/0188422 A1 Aug. 16, 2007

Related U.S. Application Data

(62) Division of application No. 10/741,599, filed on Dec. 22, 2003, now Pat. No. 7,221,092.

(30) Foreign Application Priority Data

Dec. 27, 2002 (JP) ................................ 2002-379297

(51) Int. Cl.
*G09G 3/30* (2006.01)
*G09G 5/10* (2006.01)
(52) U.S. Cl. .......... 345/76; 345/206; 345/204; 345/690; 315/169.3
(58) Field of Classification Search .............. 345/76–84, 345/204–206, 87–102, 690, 211
See application file for complete search history.

(56) References Cited

U.S. PATENT DOCUMENTS

| 5,493,129 A | 2/1996 | Matsuzaki |
| 5,680,488 A | 10/1997 | Shimooku |
| 5,703,436 A | 12/1997 | Forrest |
| 6,304,309 B1 | 10/2001 | Yamanaka |
| 6,424,093 B1 | 7/2002 | Mir |

(Continued)

FOREIGN PATENT DOCUMENTS

EP 0 942 407 A1 9/1999

(Continued)

OTHER PUBLICATIONS

Exhibition of Active Matrix Type Organic EL Display at "13$^{th}$ Flat Panel Display Manufacturing Technology Expo & Conference" by ELDis Group (*in Japanese with full translation*); Jul. 2, 2003.

(Continued)

*Primary Examiner* — Duc Dinh
(74) *Attorney, Agent, or Firm* — Fish & Richardson P.C.

(57) ABSTRACT

The invention provides a portable information terminal, such as a notebook PC, including light-emitting elements entirely having longer lives (a double-sided display panel having longer lives) and allowing lower power consumption with a double-sided display panel having a first screen on one surface of a substrate in the portable information terminal, such as a notebook PC, and a second screen on the other surface of the substrate on the opposite side of the first screen. In this case, light emission intensities and aperture ratios of the first and second screens may be differentiated for different applications of the first and second screens. One of the first screen and second screen may implement multi-color display, and the other may implement monochrome display. The double-sided display panel may be used in a lid of a portable information terminal, such as a notebook PC, and a touch-panel function may be provided thereto. Thus, a portable terminal such as PC can be manipulated easily even with the lid closed. Therefore, the portable terminal can be used easily even on the move.

49 Claims, 14 Drawing Sheets

U.S. PATENT DOCUMENTS

| | | |
|---|---|---|
| 6,466,292 B1 | 10/2002 | Kim |
| 6,501,227 B1 | 12/2002 | Koyama |
| 6,529,178 B1 | 3/2003 | Kimura |
| 6,570,337 B1 | 5/2003 | Wakai et al. |
| 6,583,776 B2 | 6/2003 | Yamazaki et al. |
| 6,700,330 B2 | 3/2004 | Koyama |
| 6,819,309 B1 * | 11/2004 | Kishi .............................. 345/87 |
| 6,819,386 B2 | 11/2004 | Roosendaal et al. |
| 6,833,668 B1 | 12/2004 | Yamada et al. |
| 6,900,785 B2 | 5/2005 | Kimura |
| 6,909,409 B2 | 6/2005 | Tanada |
| 6,965,195 B2 | 11/2005 | Yamazaki et al. |
| 7,012,364 B2 | 3/2006 | Mori |
| 7,038,668 B2 | 5/2006 | Kota et al. |
| 7,071,911 B2 | 7/2006 | Inukai |
| 7,129,917 B2 | 10/2006 | Yamazaki et al. |
| 7,164,153 B2 | 1/2007 | Lee et al. |
| 7,184,012 B1 | 2/2007 | Kim |
| 7,215,313 B2 | 5/2007 | Giraldo et al. |
| 7,333,077 B2 | 2/2008 | Koyama et al. |
| 7,592,984 B2 | 9/2009 | Koyama et al. |
| 7,608,992 B2 | 10/2009 | Kobayashi |
| 7,616,173 B2 | 11/2009 | Tanada |
| 7,995,010 B2 | 8/2011 | Yamazaki et al. |
| 2001/0055384 A1 | 12/2001 | Yamazaki |
| 2002/0064684 A1 | 5/2002 | Seo |
| 2002/0097194 A1 | 7/2002 | Uchida |
| 2002/0167270 A1 | 11/2002 | Siwinski |
| 2002/0191135 A1 | 12/2002 | Kim |
| 2003/0230972 A1 | 12/2003 | Cok |
| 2004/0113545 A1 | 6/2004 | Pang |
| 2004/0239658 A1 | 12/2004 | Koyama |
| 2004/0245529 A1 | 12/2004 | Yamazaki |
| 2004/0245531 A1 | 12/2004 | Fuii |
| 2005/0040753 A1 | 2/2005 | Osame |
| 2011/0109604 A1 | 5/2011 | Yamazaki et al. |

FOREIGN PATENT DOCUMENTS

| | | |
|---|---|---|
| EP | 1 164 560 A1 | 12/2001 |
| EP | 1 227 390 | 7/2002 |
| EP | 1 580 708 A1 | 9/2005 |
| JP | 56-100892 A | 8/1981 |
| JP | 56-143873 U | 10/1981 |
| JP | 63-064082 A | 3/1988 |
| JP | 02-112194 A | 4/1990 |
| JP | 07-220871 | 8/1995 |
| JP | 07-253505 A | 10/1995 |
| JP | 08-031571 A | 2/1996 |
| JP | 08-152619 | 6/1996 |
| JP | 08-220303 A | 8/1996 |
| JP | 10-074585 A | 3/1998 |
| JP | 10-255976 | 9/1998 |
| JP | 10-255976 A | 9/1998 |
| JP | 11-073139 A | 3/1999 |
| JP | 2000-003786 A | 1/2000 |
| JP | 2000-100558 A | 4/2000 |
| JP | 2000-173766 A | 6/2000 |
| JP | 2001-051660 A | 2/2001 |
| JP | 2001-067049 A | 3/2001 |
| JP | 2001-075503 A | 3/2001 |
| JP | 2001-075532 A | 3/2001 |
| JP | 2001-093661 A | 4/2001 |
| JP | 2001-126861 A | 5/2001 |
| JP | 2001-184010 A | 7/2001 |
| JP | 2001-312228 | 11/2001 |
| JP | 2001-332392 | 11/2001 |
| JP | 2001-356714 | 12/2001 |
| JP | 2002-040990 A | 2/2002 |
| JP | 2002-075657 A | 3/2002 |
| JP | 2002-123212 A | 4/2002 |
| JP | 2002-229054 A | 8/2002 |
| JP | 2002-252089 A | 9/2002 |
| JP | 2002-260846 A | 9/2002 |
| JP | 2002-296063 | 10/2002 |
| JP | 2003-122306 A | 4/2003 |
| JP | 3408154 | 5/2003 |
| JP | 2003-317959 | 11/2003 |
| JP | 2003-345271 | 12/2003 |
| JP | 2004-040464 A | 2/2004 |
| JP | 2004-086014 A | 3/2004 |
| JP | 2005-504359 A | 2/2005 |
| JP | 2005-520193 A | 7/2005 |
| JP | 4373331 B2 | 11/2009 |
| KR | 2001-102368 A | 11/2001 |
| WO | 98/36405 A1 | 8/1998 |
| WO | 03-029888 A1 | 4/2003 |
| WO | 03/077231 A2 | 9/2003 |
| WO | 2004-026001 A1 | 3/2004 |

OTHER PUBLICATIONS

Documents distributed in the "13<sup>th</sup> Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper (in Japanese with full translation)*; Jul. 3, 2003.

International Search Report (Application No. PCT/JP03/16353) dated Mar. 2, 2004.

International Preliminary Examination Report (Application No. PCT/JP03/16353) dated Mar. 30, 2004 (w/partial translation).

Kwan Hee Lee et al.; "QCIF Full Color Transparent AMOLED Display"; *2003 SID International Symposium Digest of Technical Papers*, vol. XXXIV, Book 1; pp. 104-107; May 2003.

Korean Office Action (KR Patent Application No. 2011-7023078) dated Dec. 27, 2011 with English translation, 7 pages.

* cited by examiner (A)

(B)

(A)

(B)

(A)

(B)

(C)

(A)

(B)

(A)

(B)

DISPLAY DEVICE

TECHNICAL FIELD

The present invention relates to a display device including light-emitting elements and, in particular, to a portable information terminal such as a notebook personal computer (called notebook PC hereinafter).

BACKGROUND ART

In recent years, instead of a liquid crystal display (LCD) having pixels containing liquid crystal elements, a display device having a light-emitting element typically such as an electroluminescence (EL) element has been studied and developed as a light-emitting device. The wide use of the light-emitting device has been expected as a display screen image or display device of a mobile telephone by taking advantage of high quality and wide viewing angles based on the light-emitting type and thinness and lightweight based on the unnecessity of backlights.

However, currently, from the viewpoint of the reliability (life) of an EL material, the luminance has been deteriorated, which is a problem. In a case where a multi-color display is conducted, there is a problem that the degrees of luminance deterioration differ among R, G and B elements.

Since the size and weight of a portable information terminal such as a notebook PC can be reduced significantly, the portable information terminal can be carried easily, and then can be more often used in an unstable state such as in a smaller place comparatively like in a train or an automobile and while walking. Since, in the use of the portable information terminal in such an unstable state, an operation of opening the lid of the notebook PC and manipulating keys by both hands are difficult, a portable information terminal has been demanded which can be used easily even on the move.

DISCLOSURE OF THE INVENTION

In a display device according to the invention mounted a double-sided display panel having a first screen on one surface of a substrate and a second screen on the opposite surface of the one surface of the substrate, the device is characterized in that intensities of light emitted from the first screen and the second screen are different from each other.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

each of the multiple pixels having a first light-emitting element contributing to display on the first screen and a second light-emitting element contributing to display on the second screen; and means for differentiating intensities of light emitted from the first light-emitting element and second light-emitting element.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

each of the multiple pixels having a first light-emitting element contributing to display on the first screen and a second light-emitting element contributing to display on the second screen; and means for differentiating amounts of current to be fed to the first light-emitting element and second light-emitting element.

A display device according to the invention is a display device mounted a double-sided display panel having a first screen on one surface of a substrate and a second screen on the opposite surface of the one surface of the substrate, the device is characterized in that aperture ratios of pixels of the first screen and the second screen are different from each other.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

each of the multiple pixels having a first light-emitting element contributing to display on the first screen and a second light-emitting element contributing to display on the second screen;

the first light-emitting element having a first pixel electrode; and the second light-emitting element having a second pixel electrode, wherein an area of the first pixel electrode is different from that of the second pixel electrode.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

each of the multiple pixels having a first light-emitting element contributing to display on the first screen and a second light-emitting element contributing to display on the second screen;

the first light-emitting element having a first pixel electrode; and the second light-emitting element having a second pixel electrode, wherein an area of a pixel electrode having a light-emitting element contributing to display on a frequently used screen of the first screen and the second screen is larger than that of a pixel electrode having a light-emitting element contributing to display on the other infrequently used screen.

A display device according to the invention is a display device mounted a double-sided display panel having a first screen on one surface of a substrate and a second screen on the opposite surface of the one surface of the substrate, the device characterized by including:

the double-sided display panel having multiple pixels;

each of the multiple pixels having a first light-emitting element contributing to display on the first screen and a second light-emitting element contributing to display on the second screen;

the first light-emitting element having a first pixel electrode;

the second light-emitting element having a second pixel electrode;

the first pixel electrode having a different area from that of the second pixel electrode; and means for differentiating amounts of current to be fed to the first light-emitting element and second light-emitting element.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

each of the multiple pixels having a first light-emitting element contributing to display on the first screen, a second light-emitting element contributing to display on the second screen, a first thin film transistor, and a second thin film transistor;

the first light-emitting element having a first pixel electrode; and the second light-emitting element having a second pixel electrode, wherein the first pixel electrode is electrically connected to the source or the drain of the first thin film transistor;

wherein the second pixel electrode is electrically connected to the source or the drain of the second thin film transistor; and wherein the first thin film transistor and the second thin film transistor have different channel sizes.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

one of the first screen and the second screen implementing multi-color display by using light-emitting elements for multiple colors and the other implementing monochrome display by using light-emitting elements for a most reliable color among the light-emitting elements for multiple colors;

the pixels having the most reliable light-emitting elements of the multiple pixels comprise a first light-emitting element contributing to display on the first screen and a second light-emitting element contributing to display on the second screen; and means for differentiating intensities of light emitted from the first light-emitting element and second light-emitting element.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

one of the first screen and the second screen implementing multi-color display by using light-emitting elements for multiple colors and the other implementing monochrome display by using light-emitting elements for a most reliable color among the light-emitting elements for multiple colors;

the pixels having the most reliable light-emitting elements of the multiple pixels comprise a first light-emitting element contributing to display on the first screen and a second light-emitting element contributing to display on the second screen; and means for differentiating amounts of current to be fed to the first light-emitting element and second light-emitting element.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

one of the first screen and the second screen implementing multi-color display by using light-emitting elements for multiple colors and the other implementing monochrome display by using light-emitting elements for a most reliable color among the light-emitting elements for multiple colors;

the pixels having the most reliable light-emitting elements of the multiple pixels comprise a first light-emitting element contributing to display on the first screen and a second light-emitting element contributing to display on the second screen;

the first light-emitting element having a first pixel electrode; and the second light-emitting element having a second pixel electrode, wherein an area of the first pixel electrode is different from that of the second pixel electrode.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

one of the first screen and the second screen implementing multi-color display by using light-emitting elements for multiple colors and the other implementing monochrome display by using light-emitting elements for a most reliable color among the light-emitting elements for multiple colors;

the pixels having the most reliable light-emitting elements of the multiple pixels comprise a first light-emitting element contributing to display on the first screen and a second light-emitting element contributing to display on the second screen;

the first light-emitting element having a first pixel electrode; and the second light-emitting element having a second pixel electrode, wherein an area of a pixel electrode having a light-emitting element contributing to display on a frequently used screen of the first screen and the second screen is larger than that of a pixel electrode having a light-emitting element contributing to display on the other infrequently used screen.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

one of the first screen and the second screen implementing multi-color display by using light-emitting elements for multiple colors and the other implementing monochrome display by using light-emitting elements for a most reliable color among the light-emitting elements for multiple colors;

the pixels having the most reliable light-emitting elements of the multiple pixels comprise a first light-emitting element contributing to display on the first screen and a second light-emitting element contributing to display on the second screen;

the first light-emitting element having a first pixel electrode;

the second light-emitting element having a second pixel electrode;

the first pixel electrode having a different area from that of the second pixel electrode; and means for differentiating amounts of current to be fed to the first light-emitting element and the second light-emitting element.

A display device according to the invention is a display device mounted a double-sided display panel having a first screen on one surface of a substrate and a second screen on the opposite surface of the one surface of the substrate, and the device is characterized by including:

the double-sided display panel having multiple pixels;

one of the first screen and the second screen implementing multi-color display by using light-emitting elements for multiple colors and the other implementing monochrome display by using light-emitting elements for a most reliable color among the light-emitting elements for multiple colors;

the pixels having the most reliable light-emitting elements of the multiple pixels comprise a first light-emitting element contributing to display on the first screen, a second light-emitting element contributing to display on the second screen, a first thin film transistor, and a second thin film transistor;

the first light-emitting element having a first pixel electrode; and the second light-emitting element having a second pixel electrode, wherein the first pixel electrode is electrically connected to the source or the drain of the first thin film transistor;

wherein the second pixel electrode is electrically connected to the source or the drain of the second thin film transistor; and wherein the first thin film transistor and the second thin film transistor have different values of channel width with respect to channel length.

A display panel applicable to the invention is a display panel having multiple pixels arranged in a matrix form. Each of the multiple pixels is characterized by having two independent pixel electrodes.

A display device according to the invention is a display device mounted a double-sided display panel having a first screen on one surface of a substrate and a second screen on the opposite surface of the one surface of the substrate, and the device is characterized in that one of the first screen and the second screen may implement multi-color display and the other may implement monochrome display.

A display panel applicable to the invention may use electroluminescence elements as light-emitting elements.

A display device according to the invention is a display device mounted a double-sided display panel having a first screen on one surface of a substrate and a second screen on the opposite surface of the one surface of the substrate, and the device is characterized by including:

one of the first screen and the second screen implementing multi-color display by using light-emitting elements for multiple colors and the other implementing monochrome display by using light-emitting elements for a most reliable color among the light-emitting elements for multiple colors.

A display device according to the invention is a display device mounted a double-sided display panel having a first screen on one surface of a substrate and a second screen on the opposite surface of the one surface of the substrate, and the display device includes monochrome light-emitting elements, and the device is characterized in that a color filter is provided in one of the first screen and the second screen.

In a display device according to the invention, a screen of the display panel may contain colored plastic or mirror finished surface type plastic.

A display device according to the invention is a display device mounted a double-sided display panel having a first screen on one surface of a substrate and a second screen on the opposite surface of the one surface of the substrate, the device is characterized in that a touch panel function is provided.

A display method for a display device according to the invention is a display method for a display device mounted a double-sided display panel having a first screen on one surface of a substrate, a second screen on the opposite surface of the one surface of the substrate and multiple pixels, and each of the multiple pixels having a first light-emitting element contributing to display on the first screen and a second light-emitting element contributing to display on the second screen, and the method characterized in that the intensities of light emitted from the first light-emitting element and second light-emitting element are differentiated.

A display method for a display device according to the invention is a display method for a display device mounted a double-sided display panel having a first screen on one surface of a substrate, a second screen on the opposite surface of the one surface of the substrate, and multiple pixels, and each of the multiple pixels having a first light-emitting element contributing to display on the first screen and a second light-emitting element contributing to display on the second screen, and the method characterized in that the luminance of light emitted from light-emitting elements having a frequently used screen of the first screen and the second screen is smaller than that of light emitted from light-emitting elements of the other infrequently used screen.

A display method for a display device according to the invention is a display method for a display device mounted a double-sided display panel having a first screen on one surface of a substrate, a second screen on the opposite surface of the one surface of the substrate, and multiple pixels, and each of the multiple pixels having a first light-emitting element contributing to display on the first screen and a second light-emitting element contributing to display of the second screen, and the method characterized in that an amount of current to be fed to the first light-emitting element is different from that of current to be fed to the second light-emitting element.

A display method for a display device according to the invention is a display method for a display device mounted a double-sided display panel having a first screen on one surface of a substrate, a second screen on the opposite surface of the one surface of the substrate, and multiple pixels, and each of the multiple pixels having a first light-emitting element contributing to display on the first screen and a second light-emitting element contributing to display on the second screen, and the method characterized in that an amount of current to be fed to a light-emitting element contributing to display on a frequently used screen of the first screen and the second screen is smaller than that of current to be fed to a light-emitting element contributing to display on the other infrequently used screen.

A display method for a display device according to the invention is a display method for a display device mounted a double-sided display panel having a first screen on one surface of a substrate, a second screen on the opposite surface of the one surface of the substrate, and multiple pixels, and each of the multiple pixels having a first light-emitting element contributing to display on the first screen and a second light-emitting element contributing to display on the second screen, the first light-emitting element having a first pixel electrode, the second light-emitting element having a second pixel electrode, and the first pixel electrode and second pixel electrode having different areas from each other, and the method characterized in that an amount of current to be fed to the first light-emitting element is different from that of current to be fed to the second light-emitting element.

A display method for a display device according to the invention is a display method for a display device mounted a double-sided display panel having a first screen on one surface of a substrate, a second screen on the opposite surface of the one surface of the substrate, and multiple pixels, and each of the multiple pixels having a first light-emitting element contributing to display on the first screen and a second light-emitting element contributing to display of the second screen, the first light-emitting element having a first pixel electrode, and the second light-emitting element having a second pixel electrode, in which an area of a pixel electrode having a light-emitting element contributing to display on a frequently used screen of the first screen and the second screen is larger than that of a pixel electrode having a light-emitting element contributing to display on the other infrequently used screen, and the method characterized in that an amount of current to be fed to the light-emitting element contributing to display on the frequently used screen of the first screen and the second screen is smaller than that of current to be fed to the light-emitting element contributing to display on the other infrequently used screen.

BEST MODE FOR CARRYING OUT THE INVENTION

Embodiment Modes of the invention will be described below.

Embodiment Mode 1

Embodiment Mode 1 describes a first example that a difference in luminance deterioration speed of light-emitting elements on first and second screens of a double-sided display panel is corrected by differentiating the light emission luminance of the first and second screens.

Figure 10:
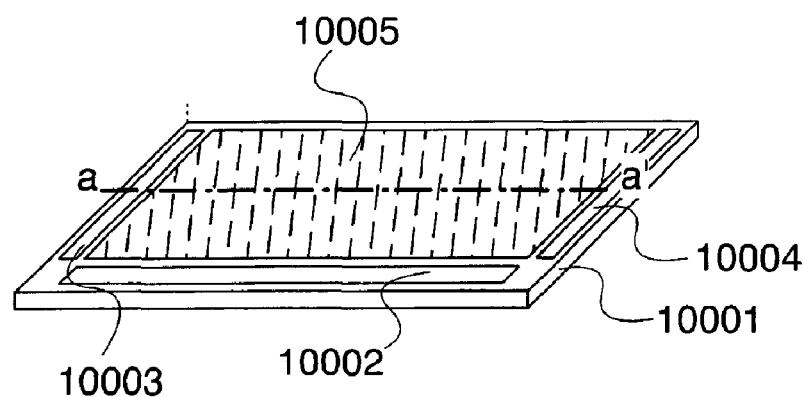
FIG. 10 is a diagram showing a double-sided display panel.
Figure 10:
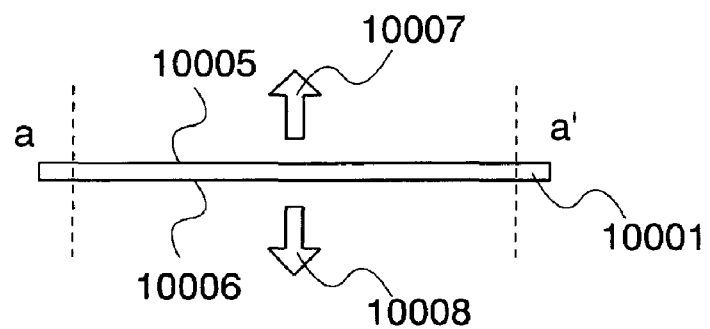

First of all, the double-sided display panel will be described with reference to FIG. 10. FIG. 10(A) is a diagram showing the double-sided display panel. FIG. 10(B) is a diagram showing a section view taken by a line a-a' in FIG. 10(A). FIG. 10 includes a substrate 10001, a source signal line driver circuit 10002, a first gate signal line driver circuit 10003 and a second gate signal line driver circuit 10004. The double-sided display panel has a first screen 10005 on one surface of the substrate 10001 and has a second screen 10006 on the surface of the substrate 10001 on the opposite side of the first screen 10005. The first screen 10005 displays in the direction indicated by the arrow 10007 while the second screen 10006 displays in the direction indicated by the arrow 10008. FIG. 10 shows an example of the double-sided display panel. The numbers and positions of source signal line driver circuits and gate signal line driver circuits to be provided may be changed as required.

Figure 5:
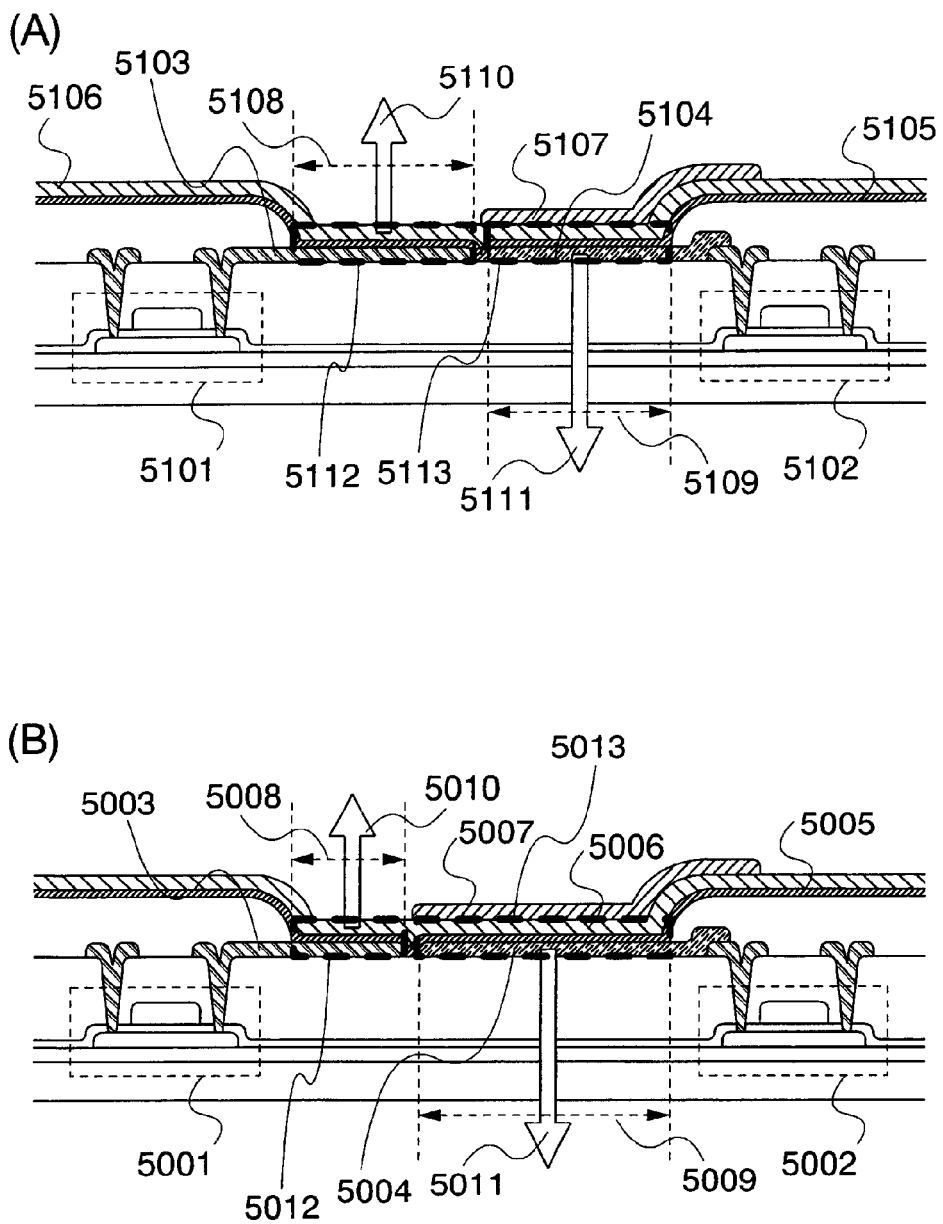
FIG. 5 is a diagram showing a section view of a pixel construction of the invention.

Next, FIG. 5(A) shows an example of a section structure of one pixel of the double-sided display panel. Here, one pixel on a multi-color display panel having R (red), G (green) and B (blue) light-emitting elements is an area having a light-emitting element in one of R, G and B colors in this specification.

FIG. 5(A) includes a first drive TFT 5101, a second drive TFT 5102, a first pixel electrode 5103 containing a reflective material, for example, a second pixel electrode 5104 containing a translucent material, for example, an EL layer 5015, an opposed electrode 5016 containing a translucent material, for example, a reflective film 5107 containing a reflective material, a first display area 5108, a second display area 5109, a first light-emitting element 5112 and a second light-emitting element 5113. The first display area 5108 and the second display area 5109 have a same size. The first light-emitting element 5112 includes the first pixel electrode 5103, the EL layer 5105 and the opposed electrode 5106. The second light-emitting element 5113 includes the second pixel electrode 5104, the EL layer 5105 and the opposed electrode 5106. The light emission of the first light-emitting element 5112 in the first display area 5108 contributes to display of the first screen. The light emission of the second light-emitting element 5113 in the second display area 5109 contributes to display of the second screen.

In the first display area 5108, current flows between the first pixel electrode 5103 connecting to the first drive TFT 5101 and the opposed electrode 5106. Thus, the EL layer 5105 in the first display area 5108 can emit light. Since the first pixel electrode 5103 contains a reflective material and the opposed electrode 5106 contains a translucent material, light can be emitted from the EL layer 5105 toward the opposed electrode (direction indicated by the arrow 5110). In other words, the first light-emitting element 5112 emits light in the direction indicated by the arrow 5110.

A translucent material in this specification is a transparent conductive film of ITO, for example, or aluminum, for example, having a thickness through which light can pass. A reflective material in this specification is a conductive material of aluminum, for example, having a light-reflective characteristic.

In the second display area, current flows between the second pixel electrode 5104 connecting to the second drive TFT 5102 and the opposed electrode 5106. Thus, the EL layer 5105 in the second display area 5109 can emit light. In this case, since the second pixel electrode 5104 contains a translucent material and the reflective film 5107 is provided on the opposed electrode 5106, light is emitted from the EL layer 5105 toward the second pixel electrode 5104 (in the direction indicated by the arrow 5111). In other words, the second light-emitting element 5113 emits light in the direction indicated by the arrow 5111. The double-sided display panel shown in FIG. 5(A) is characterized by having two independent pixel electrodes (including a first pixel electrode and a second pixel electrode).

Figure 1:
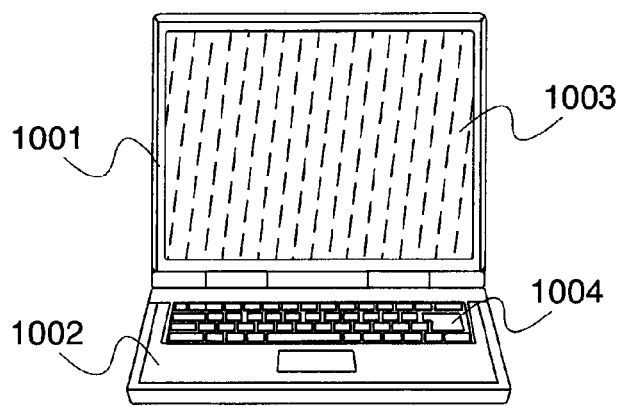
FIG. 1 is a diagram showing a portable information terminal having a double-sided display panel on a lid thereof.
Figure 1:
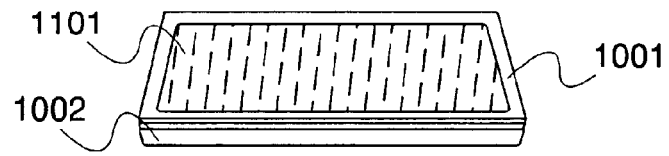

FIG. 1 shows a state that the double-sided display panel shown in FIG. 5(A) is provided on the lid of a portable information terminal such that display can be implemented on the both sides of the lid. For example, FIG. 1(A) shows a state that a notebook PC is open, and FIG. 1(B) shows a state that the notebook PC is closed.

The notebook PC has a first cabinet (lid) 1001 and a second cabinet 1002. The first cabinet 1001 has a double-sided display panel. The second cabinet 1002 has operation keys 1004 and so on. The double-sided display panel has the first screen 1003 and the second screen 1101 on the front and back, respectively.

The first screen 1003 can display when the notebook PC is opened (FIG. 1(A)) while the second screen 1101 can display when the lid 1001 is closed. The first screen 1003 is more frequently used to display with the notebook PC open than the second screen 1101 displayed with the lid closed. Therefore, a light-emitting element (corresponding to the first light-emitting element 5112 in FIG. 5(A)) contributing to the display of the first screen 1003 is faster in luminance deterioration than a light-emitting element (corresponding to the second light-emitting element 5113 in FIG. 5(A)) contributing to display of the second screen 1101 and becomes unusable earlier. In this case, even when the luminance deterioration of the light-emitting element contributing to display of the second screen 1101 does not advance and is still sufficiently usable, the notebook PC can no longer function. However, when the speeds of the luminance deterioration of the light-emitting element contributing to display of the first display area and light-emitting element contributing to display of the second display area are substantially equal, the life of the double-sided display panel can be increased. Accordingly, by using a smaller amount of current to be fed to the light-emitting element (the first light-emitting element 5112 in FIG. 5(A)) contributing to display of the first screen than the amount of current to be fed to the light-emitting element (the second light-emitting element 5113 in FIG. 5(A)) contributing to display of the second screen, the luminance of light emitted from the light-emitting element (the first light-emitting element 5112 in FIG. 5(A)) contributing to display of the first screen 1003 can be lower than the luminance of light emitted from the light-emitting element (the second light-emitting element 5113 in FIG. 5(A)) contributing to display of the second screen 1101. Thus, the difference in speed of the luminance deterioration can be decreased between the light-emitting elements contributing to display of the first screen and second screen.

In FIG. 5(A), in order to feed a smaller amount of current to the first light-emitting element 5112 than the amount of current to be fed to the second light-emitting element 5113, the first drive TFT 5101 only needs to have a smaller channel size (channel width/channel length) than the channel size (channel width/channel length) of the second drive TFT 5102, for example. Alternatively, a smaller amount of current can be fed to the first light-emitting element 5112 than the amount of current to be fed to the second light-emitting element 5113 by achieving $|Vgs_1|<|Vgs_2|$ where $Vgs_1$ is voltage between the gate and source of the first drive TFT 5101 and $Vgs_2$ is voltage between the gate and source of the second drive TFT 5102. In order to achieve $|Vgs_1|<|Vgs_2|$, the potentials may be differentiated between video signals to be applied to the gate of the first drive TFT 5101 and video signals to be applied to the gate of the second drive TFT 5102. Alternatively, the potentials may be differentiated between signals to be applied to the first pixel electrode and signals to be applied to the second pixel electrode.

Figure 11:
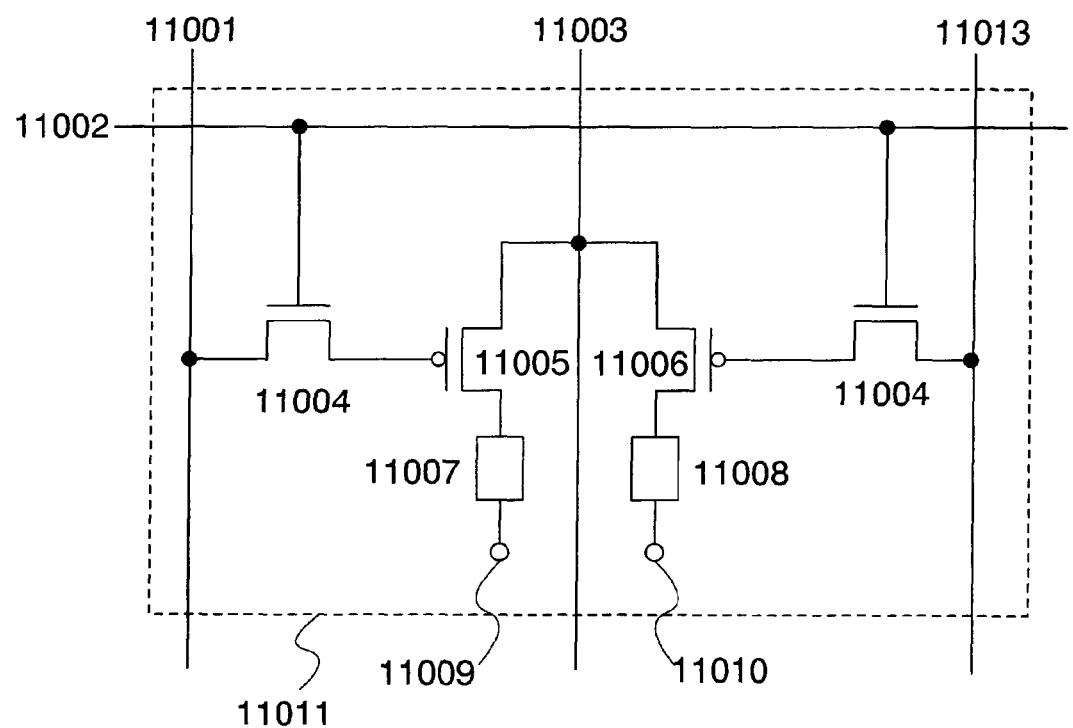
FIG. 11 is a diagram showing a section view of a pixel construction of the invention.

First of all, an example that the potentials are differentiated between video signals to be applied to the gate of the first drive TFT 5101 and video signals to be applied to the gate of the second drive TFT 5102 will be described with reference to FIG. 11. In FIG. 11, a part within a dashed-line frame 11011 is one pixel. FIG. 11 includes a first source signal line 11001, a gate signal line 11002, a current supply line 11003, a first switching TFT 11004, a first drive TFT 11005, a second drive TFT 11006, a first light-emitting element 11007, a second light-emitting element 11008, opposed electrodes 11009 and 11010, a second switching TFT 11012 and a second source signal line 11013. In each pixel, an area receiving light emitted from the first light-emitting element 11007 is a first display area, and an area receiving light emitted from the second light-emitting element 11008 is a second display area. One pixel includes both display areas. The gate electrode of the first switching TFT 11004 is electrically connected to the gate signal line 11002. The first electrode is electrically connected to the first source signal line 11001. The second electrode is electrically connected to the gate electrode of the first drive TFT 11005. The gate electrode of the second switching TFT 11012 is electrically connected to the gate signal line 11002. The first electrode is electrically connected to the second source signal line 11013. The second electrode is electrically connected to the gate electrode of the second drive TFT 11006. The first electrode of the first drive TFT 11005 is electrically connected to the current supply line 11003. The second electrode is electrically connected to the first electrode of the first light-emitting element 11007. The first electrode of the second drive TFT 11006 is electrically connected to the current supply line 11003. The second electrode is electrically connected to the first electrode of the second light-emitting element 11008. The second electrode of the first light-emitting element 11007 and the second electrode of the second light-emitting element 11008 are electrically connected to the opposed electrodes 11009 and 11010, respectively, each having a potential difference with respective to the current supply line. $|Vgs_1|<|Vgs_2|$ can be achieved by differentiating the potential of video signals to be applied to the first source signal line 11001 and the potential of video signals to be applied to the second source signal line 11013. Under this circuit construction, the first and second source signal lines are provided. Thus, different video signals can be supplied from these source signal lines, and the display of the first screen and second screen can be therefore differentiated.

Figure 12:
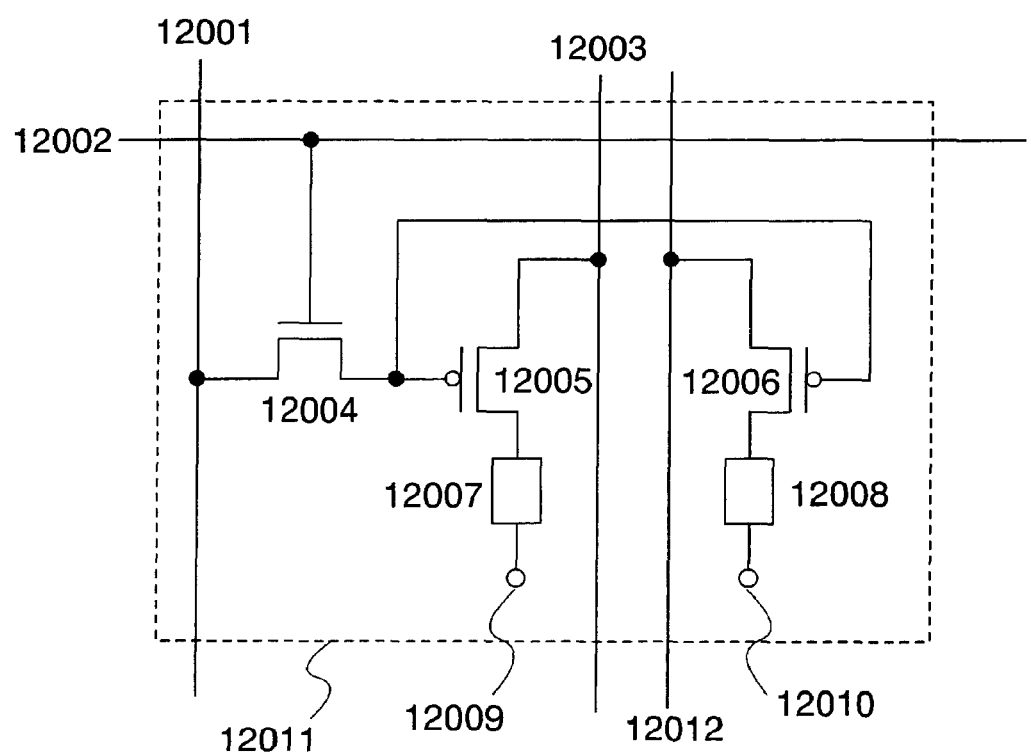
FIG. 12 is a diagram showing a section view of a pixel construction of the invention.

Next, an example that the potential of signals to be applied to the first pixel electrode and the potential of signals to be applied to the second pixel electrode are differentiated will be described with reference to FIG. 12. In FIG. 12, a part within a dashed-line frame 12011 is one pixel. FIG. 12 includes a source signal line 12001, a gate signal line 12002, a first current supply line 12003, a switching TFT 12004, a first drive TFT 12005, a second drive TFT 12006, a first light-emitting element 12007, a second light-emitting element 12008, opposed electrodes 12009 and 12010, and a second current supply line 12012. In each pixel, an area receiving light emitted from the first light-emitting element 12007 is a first display area, and an area receiving light emitted from the second light-emitting element 12008 is a second display area. One pixel includes both display areas. The gate electrode of the switching TFT 12004 is electrically connected to the gate signal line 12002. The first electrode is electrically connected to the source signal line 12001. The second electrode is electrically connected to the gate electrode of the first drive TFT

12005. The first electrode of the first drive TFT 12005 is electrically connected to the first current supply line 12003. The second electrode is electrically connected to the first electrode of the first light-emitting element 12007. The first electrode of the second drive TFT 12006 is electrically connected to the second current supply line 12012. The second electrode is electrically connected to the first electrode of the second light-emitting element 12008. The second electrode of the first light-emitting element 12007 and the second electrode of the second light-emitting element 12008 are electrically connected to the opposed electrodes 12009 and 12010, respectively, each having a potential difference with respective to the current supply line. $|Vgs_1|<|Vgs_2|$ can be achieved by differentiating the potential to be applied from the first current supply line 12003 to the first electrode of the first drive TFT 12005 and the potential to be applied from the second current supply line 12012 to the first electrode of the second drive TFT 12006.

As described above, in the double-sided display panel, by achieving the lower luminance of light emitted from a frequently used screen than the luminance of light emitted from an infrequently used screen, a difference in speed of luminance deterioration of light-emitting elements due to a difference of frequencies of both of the screens of the double-sided display panel can be reduced. Thus, the life of the double-sided display panel can be increased.

While the first screen is displayed with the notebook PC open and the second screen is displayed with the notebook PC closed (where the first screen is used more frequently) according to this embodiment mode, but the invention is not limited thereto. The luminance of light emitted from a frequently used screen only needs to be lower than the luminance of light emitted from an infrequently used screen. Furthermore, while, according to this embodiment mode, a notebook PC has been described as an example of a portable information terminal, the invention is not limited to a notebook PC. Instead of a notebook PC, one having an application that the use frequencies of first and second screens of a double-sided display panel are different may be applied to a display panel of the invention.

Apparently, as a method for allowing the multi-color display of a double-sided display panel of the invention, a publicly known multi-color display method may be used such as a RGB color-coding method in which EL layers emitting light in R, G and B colors are painted differently, a color filter method in which a color filter is combined with an EL layer emitting white light, and a color conversion method in which a color converting layer is combined with an EL layer emitting blue light.

Embodiment Mode 2

This embodiment mode describes an example of a signal line driver circuit for supplying video signals having different potentials to a first source signal line 11001 and a second source signal line 11013 under the circuit construction in FIG. 11.

Figure 13:
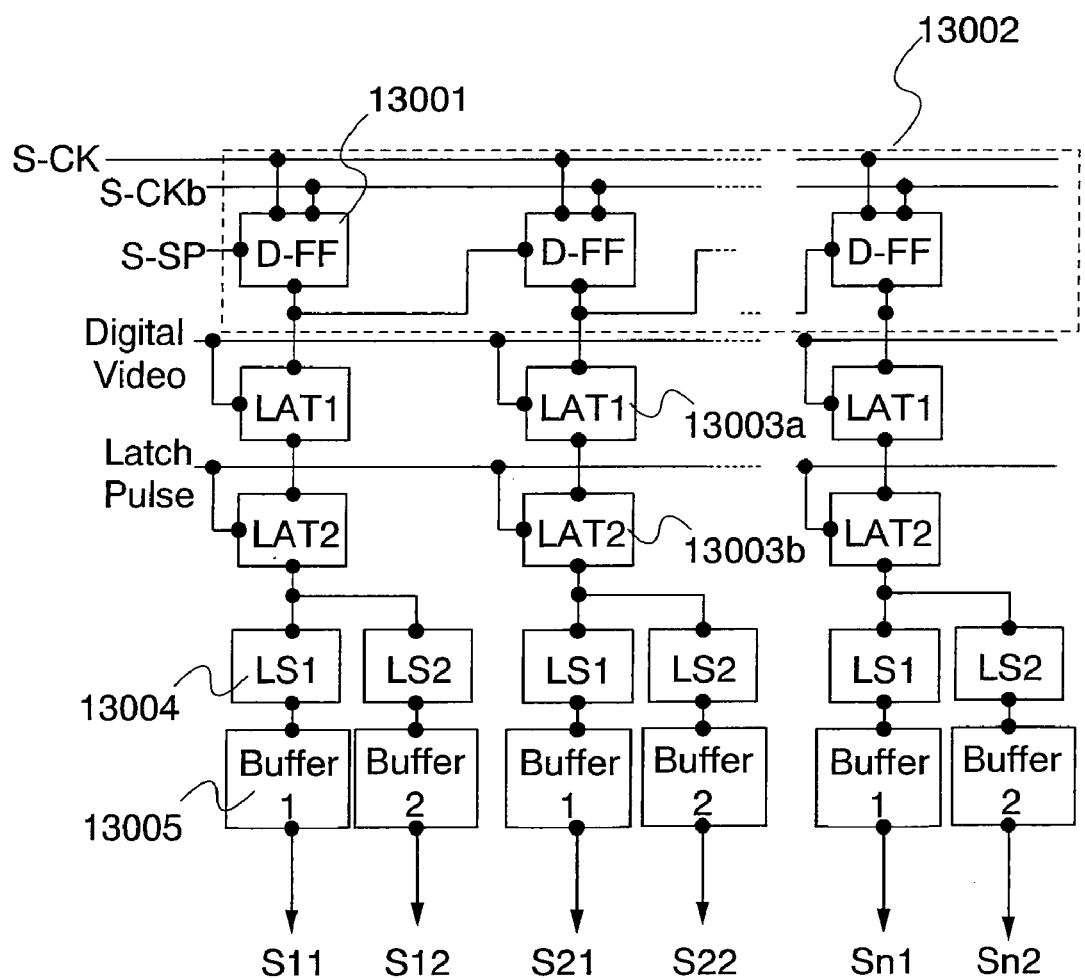
FIG. 13 is a diagram showing a construction example of a signal line driver circuit.

First of all, FIG. 13 shows a first construction example of a signal line driver circuit. FIG. 13 shows a signal line driver circuit of an m row×n column active matrix type double-sided display panel, which is a construction example of a signal line driver circuit in which video signals having different potentials are supplied to the first source signal lines 11001 and second source signal lines 11013 in FIG. 11 in order to provide same display to a first screen and a second screen. FIG. 13 includes a D-flipflop (D-FF) 13001, a shift register 13002, a first latch circuit (LAT1) 13003a, a second latch circuit (LAT2) 13003b, a level shifter (LS) 13004 and a buffer 13005. FIG. 13 further includes a clock signal (S-CK), a clock inverted signal (S-CKb), a start pulse (S-SP), a digital video signal (Digital Video), and a latch pulse (Latch Pulse). The level shifter 13004 includes a first level shifter LS1 and a second level shifter LS2. The buffer 13005 includes a first buffer Buffer1 and a second buffer Buffer2. The first level shifter and the second level shifter are connected to an output portion of the second latch circuit. The output portion of the first level shifter is connected to the input portion of the first buffer. The output portion of the second level shifter is connected to the input portion of the second buffer. The first shift register and the first buffer are connected to a same power supply. The second shift register and the second buffer are connected to a different power supply from the power supply to which the first shift register and the first buffer are connected. The shift register 13002 includes n D-flipflops 13001, and a clock signal (S-CK), a start pulse (S-SP) and a clock inverted signal (S-CKb) are input thereto. In accordance with timing of these signals, sampling pulses are sequentially output. Sampling pulses output from the shift register 13002 are input to the first latch circuit 13003a. Digital video signals (Digital Video) are input to the first latch circuit 13003a, and the first latch circuit 13003a holds the video signals in columns in accordance with timing of input of sampling pulses. Once video signals have been completely held up to the last column in the first latch circuit 13003a, a latch pulse (Latch Pulse) is input to the second latch circuit 13003b in the horizontal retrace time. The video signals held in the first latch circuit 13003a are transferred to the second latch circuit 13003b at the same time. Then, the held video signals undergo pulse amplitude conversion in the two level shifters connecting to the output of the second latch circuit, and video signal waveforms thereof are then shaped in the buffers. Then, the video signals are output to source signal lines S11 to Sn1 and S12 to Sn2. Here, the source signal line S11 refers to a first source signal line at a first column, and the source signal line Sn1 refers to a first source signal line at an $n^{th}$ column. The source signal line S12 refers to a second source signal line at a first column, and the source signal line Sn2 refers to a second source signal line at an $n^{th}$ column.

In the first construction example of the signal line driver circuit, the first shift register and the first buffer are connected to a same power supply. The second shift register and the second buffer are connected to a different power supply from the power supply to which the first shift register and the first buffer are connected. Thus, video signals having different potentials can be supplied to the first source signal line and the second source signal line.

While the first construction example illustrates a case with the digital gradation method, video signals having different potentials can be supplied to the first source signal line 11001 and the second source signal line 11013 even with an analog gradation method. Apparently, the invention is not limited to the digital gradation method.

Figure 14:
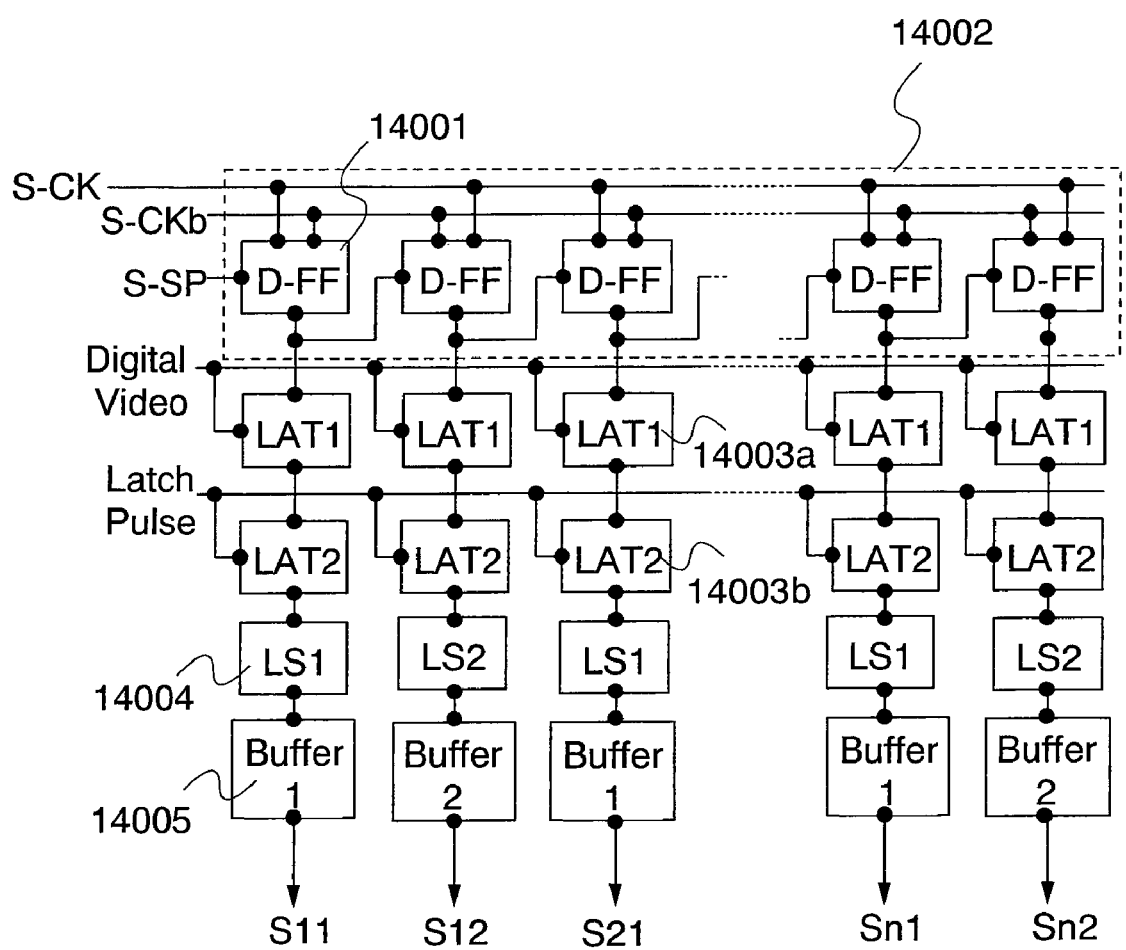
FIG. 14 is a diagram showing a construction example of a signal line driver circuit.

Next, FIG. 14 shows a second construction example of the signal line driver circuit. FIG. 14 shows a signal line driver circuit of an m row×n column active matrix type double-sided display panel, which is a construction example of a source signal line driver circuit for providing different displays to a first screen and a second screen. FIG. 14 includes a D-flipflop (D-FF) 14001, a shift register 14002, a first latch circuit (LAT1) 14003a, a second latch circuit (LAT2) 14003b, a level shifter (LS) 14004 and a buffer 14005. The level shifter 14004 includes a first level shifter LS1 and a second level shifter LS2. The buffer 14005 includes a first buffer Buffer1 and a second buffer Buffer2. The first level shifter and the second level shifter are connected to an output portion of the second latch circuits at different stages. The output portion of the first level shifter is connected to the input portion of the first buffer. The output portion of the second level shifter is connected to the input portion of the second buffer. The first shift register and the first buffer are connected to a same power supply. The second shift register and the second buffer are connected to a different power supply from the power supply to which the first shift register and the first buffer are connected. FIG. 14 includes a clock signal (S-CK), a clock inverted signal (S-CKb), a start pulse (S-SP), a digital video signal (Digital Video) and a latch pulse (Latch Pulse). The shift register 14002 includes D-flipflops 14001 at 2n stages, and the clock signal (S-CK), the start pulse (S-SP) and the clock inverted signal (S-CKb) are input thereto. In accordance with timing of these signals, sampling pulses are sequentially output. Sampling pulses output from the shift register 13002 are input to the first latch circuit 13003*a*. Digital video signals (Digital Video) are input to the first latch circuit 13003*a*, and the first latch circuit 13003*a* holds the video signals in columns in accordance with timing of input of sampling pulses. Once video signals have been completely held up to the last column in the first latch circuit 13003*a*, a latch pulse (Latch Pulse) is input to the second latch circuit 13003*b* in the horizontal retrace time. The video signals held in the first latch circuit 13003*a* are transferred to the second latch circuit 13003*b* at the same time. Then, the held video signals undergo pulse amplitude conversion in the level shifter, and video signal waveforms thereof are then shaped in the buffers. Then, the video signals are output to source signal lines S11 to Sn1 and S12 to Sn2. Here, the source signal line S11 refers to a first source signal line at a first column, and the source signal line Sn1 refers to a first source signal line at an n$^{th}$ column. The source signal line S12 refers to a second source signal line at a first column, and the source signal line Sn2 refers to a second source signal line at an n$^{th}$ column.

In the second construction example of the signal line driver circuit, the first shift register and the first buffer are connected to a same power supply. The second shift register and the second buffer are connected to a different power supply from the power supply to which the first shift register and the first buffer are connected. Thus, video signals having different potentials can be supplied to the first source signal line and the second source signal line. The second construction example of the signal line driver circuit is different from the first construction example in that video signals to be supplied to the first source signal line and the second source signal line are created from different digital video signals. In the second construction example, different images can be displayed on the first screen and the second screen.

Thus, video signals having different potentials can be supplied to the first source signal line 11001 and the second source signal line 11013. While this example illustrates a case with the digital gradation method, video signals having different potentials can be supplied to the first source signal line 11001 and the second source signal line 11013 even with an analog gradation method. Apparently, the invention is not limited to the digital gradation method.

Embodiment Mode 3

Embodiment Mode 3 describes a second example in which a difference in luminance deterioration speed of light-emitting elements on a first screen and second screen of a double-sided display panel is corrected by differentiating intensities of light emitted from the first screen and the second screen. More specifically, a difference in deterioration speed of light-emitting elements on the first screen and second screen is corrected by differentiating aperture ratios of the first screen and the second screen.

FIG. 5(B) shows a section view of a double-sided display panel in one pixel in an example that aperture ratios of pixels are differentiated on the first screen and second screen. The densities of current can be differentiated between the first screen and the second screen by differentiating aperture ratios of pixels in the first screen and the second screen, that is, by differentiating areas of pixel electrodes each contributing to EL light emission for one pixel between the first screen and the second screen.

FIG. 5(B) includes a first drive TFT 5001, a second drive TFT 5002, a first pixel electrode 5003 containing reflective material, for example, a second pixel electrode 5004 containing a translucent material, for example, an EL layer 5005, an opposed electrode 5006 containing a translucent material, for example, a reflective film 5007 containing a reflective material, a first display area 5008, a second display area 5009, a first light-emitting element 5012 and a second light-emitting element 5013. The light emission by the first light-emitting element 5012 in the first display area 5008 contributes to display of the first screen. The light emission by the second light-emitting element 5013 in the second display area 5011 contributes to display of the second screen.

In the first display area 5008, current flows between the first pixel electrode 5003 connecting to the first drive TFT 5001 and the opposed electrode 5006. Thus, the EL layer 5005 in the first display area 5008 can emit light. Since the first pixel electrode 5003 contains a reflective material and the opposed electrode 5006 contains a translucent material, light can be emitted from the EL layer 5005 toward the opposed electrode (in the direction indicated by the arrow 5010). In other words, the first light-emitting element 5012 emits light in the direction indicated by the arrow 5010.

In the second display area 5009, current flows between the second pixel electrode 5004 connecting to the second drive TFT 5002 and the opposed electrode 5006. Thus, the EL layer 5005 in the second display area 5009 can emit light. In this case, since the second pixel electrode 5004 contains a translucent material and the reflective film 5007 is provided on the opposed electrode 5006 in the second display area 5009, light is emitted from the EL layer 5005 in the direction of the second pixel electrode 5004 (in the direction indicated by the arrow 5011). In other words, the second light-emitting element 5013 emits light in the direction indicated by the arrow 5011.

As described above, areas of the first pixel electrode 5003 and the second pixel electrode 5004 are differentiated so that the densities of current can be differentiated between the light-emitting element contributing to display of the first screen and the light-emitting element contributing to the display of the second screen. Then, a smaller density of current is provided to a light-emitting element contributing to display of a frequently used screen than that of a light-emitting element contributing to display of an infrequently used screen, that is, a higher aperture ratio is provided to a frequently used screen than that of an infrequently used screen. Thus, a difference in speed of luminance deterioration can be reduced in the infrequently used screen and the frequently used screen, and the life of the double-sided display panel can be increased thereby. The construction according to this embodiment mode is effective for a case that a first screen and a second screen have different frequencies.

While FIG. 5(B) shows an example that the area of the first pixel electrode 5003 is smaller than the area of the second pixel electrode 5004, the invention is not limited thereto. By providing a smaller density of current to a frequently used screen than the density of current of an infrequently used screen, that is, by providing a higher aperture ratio to a frequently used screen than the aperture ratio of an infrequently used screen, the area of the first pixel electrode 5003 can be larger than the area of the second pixel electrode 5004.

This embodiment mode can be implemented in combination with Embodiment Mode 1. In other words, both aperture ratio and luminance of emitted light can be differentiated between a first screen and a second screen. By providing a higher aperture ratio to a frequently used screen and a low luminance of emitted light to a frequently used screen, a difference in deterioration speed can be reduced between the screens. By differentiating both luminance of emitted light and aperture ratio from each other, a higher luminance of emitted light can be provided to a frequently used screen than a case that the intensities of emitted light are only differentiated.

Embodiment Mode 4

Figure 2:
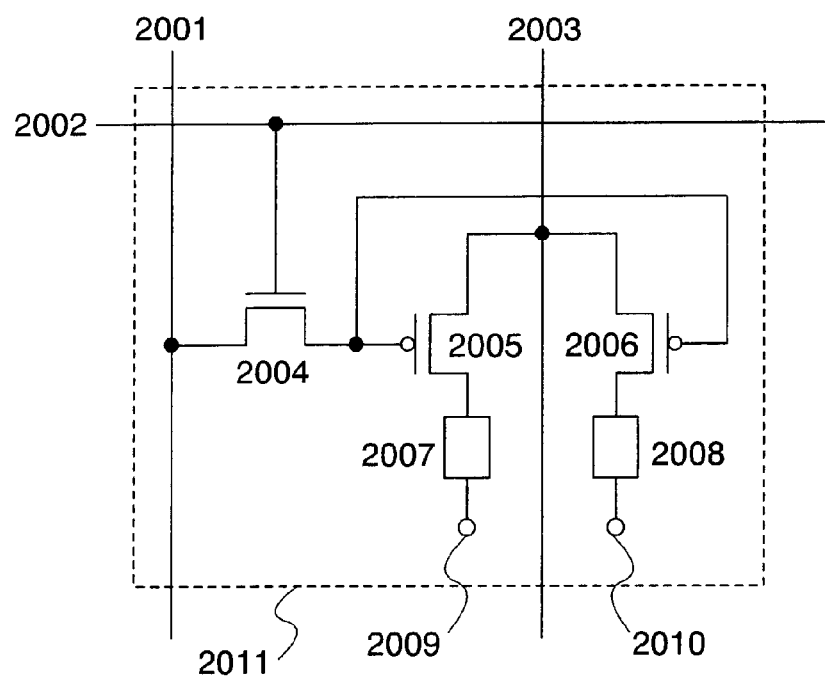
FIG. 2 is a diagram showing a pixel construction of the invention.

Embodiment Mode 4 describes a circuit configuration for controlling the displaying/hiding of first and second screens of a double-sided display panel. FIG. 2 shows a circuit diagram of an embodiment mode of the invention. While a thin-film transistor (TFT) is used as a switch element and/or a drive element here, the invention is not limited thereto. For example, any one of a MOS transistor, an organic transistor, a molecular transistor and so on may be used similarly. Here, one of the source region and drain region of a TFT is called first electrode while the other is called second electrode.

In FIG. 2, a part within a dashed line frame 2011 is one pixel. FIG. 2 includes a source signal line 2001, a gate signal line 2002, a current supply line 2003, a switching TFT 2004, a first drive TFT 2005, a second drive TFT 2006, a first light-emitting element 2007, and a second light-emitting element 2008. In each pixel, an area receiving light emitted from the first light-emitting element 2007 is a first display area, and an area receiving light emitted from the second light-emitting element 2008 is a second display area. One pixel includes both display areas.

The gate electrode of the switching TFT 2004 is electrically connected to the gate signal line 2002. The first electrode is electrically connected to the source signal line 2001. The second electrode is electrically connected to the gate electrodes of the first and second drive TFTs 2005 and 2006. The first electrode of the first drive TFT 2005 is electrically connected to the current supply line 2003. The second electrode is electrically connected to the first electrode of the first light-emitting element 2007. The first electrode of the second drive TFT 2006 is electrically connected to the current supply line 2003. The second electrode is electrically connected to the first electrode of the second light-emitting element 2008. The second electrode of the first light-emitting element 2007 and the second electrode of the second light-emitting element 2008 are electrically connected to the opposed electrodes 2009 and 2010, respectively, each having a potential difference with respective to that of the current supply line.

Video signals output to the source signal line 2001 are input to the gate electrodes of the first and second drive TFTs 2005 and 2006 when the switching TFT 2004 is turned on. In response to the video signals, current is fed to the first and second light-emitting elements 2007 and 2008, and the first and second light-emitting elements 2007 and 2008 emit light. As described above, the first display area and the second display area can receive light emitted from the front and back, respectively, of the substrate. In other words, both of the first screen and the second screen can display.

Figure 3:
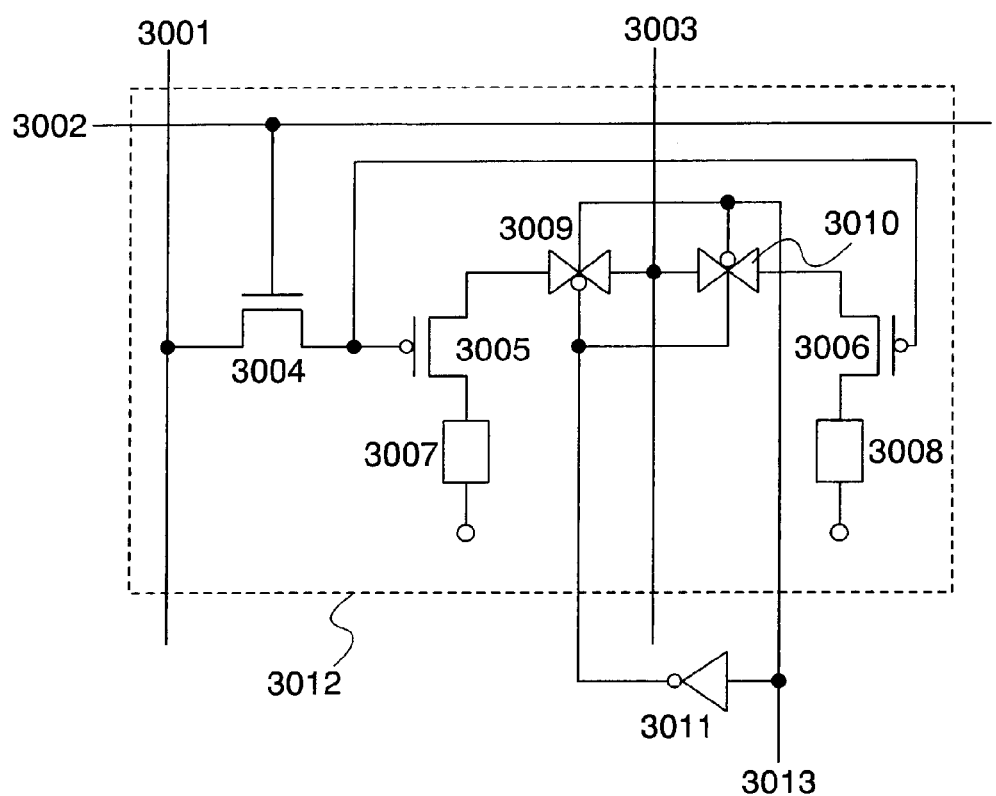
FIG. 3 is a diagram showing a pixel construction of the invention.

Under this construction, the light emission of the first light-emitting element 2007 and second light-emitting element 2008 is controlled by the first and second drive TFTs 2005 and 2006 here. However, for example, as shown in FIG. 3, exclusively operating first and second analog switches 3009 and 3010 may be provided between the current supply line 3003 and the first electrodes of the first and second drive TFTs 3005 and 3006. The ON and OFF may be controlled by a screen control signal 3013 so that the first analog switch 3009 can be turned on for a certain period. Thus, when current is fed to the first light-emitting element 3007, images can be displayed on the first screen. On the other hand, the second analog switch 3010 operating exclusively with respect to the first analog switch 3009 is turned off for the certain period, and a current supply path to the second light-emitting element 3008 is shut off. Thus, the second screen does not emit light. In other words, the first screen displays while the second screen does not display for the certain period.

Conversely, when the second analog switch 3010 is turned on, current is fed to the second light-emitting element 3008 and images are displayed on the second display area, the first analog switch 3009 is turned off and a current supply path to the first light-emitting element 3007 is shut off. Thus, the first display area does not emit light. In other words, the second screen displays while the first screen does not display. A screen control signal may be output in response to a manipulation by a user, and the screens can be switched. In accordance with a state of use (or in accordance with whether a portable information terminal is folded or not, for example), a switching operation may be performed automatically.

Figure 4:
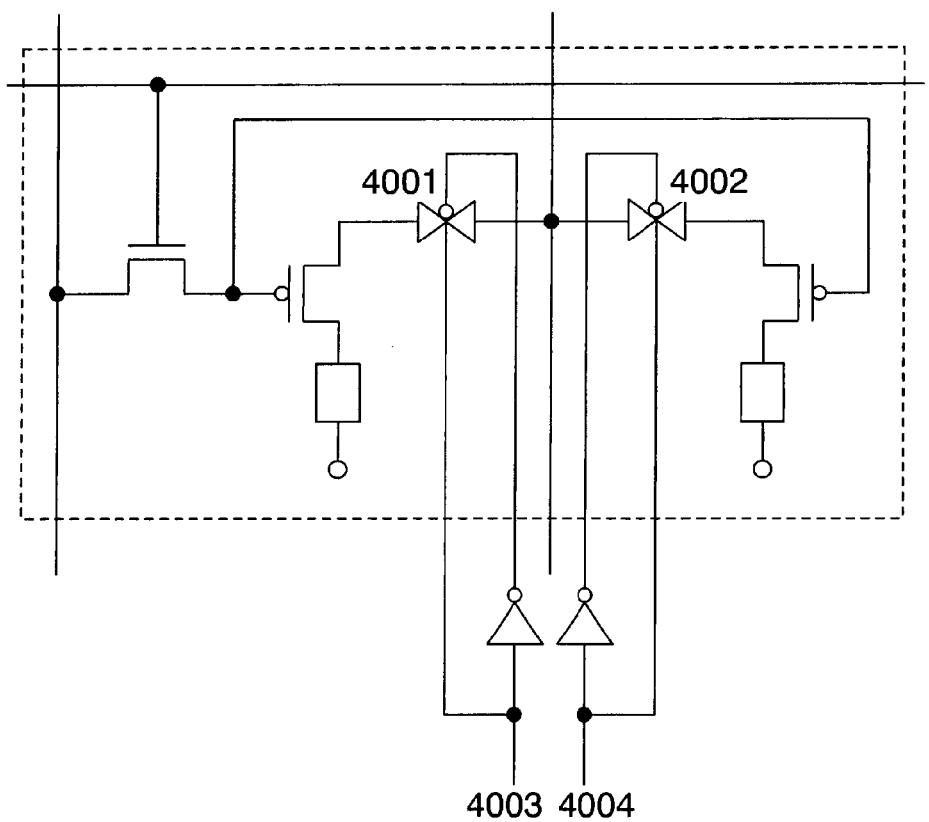
FIG. 4 is a diagram showing a pixel construction of the invention.

The first and second analog switches 3009 and 3010 may not be operated exclusively and may be controlled independently by a first screen control signal 4003 and second screen control signal 4004, as shown in FIG. 4. Under this construction, the displaying/hiding of the first display area and second display area may be switched arbitrarily. In other words, the displaying/hiding of the first screen and second screen may be switched arbitrarily.

In order to display different images on the first display area and second display area under the construction shown in FIGS. 3 and 4, odd-numbered frames and even-numbered frames in one frame period may be displayed on the first display area and the second display area, respectively. In this case, screen control signals may be inverted every one frame period, and the first and second analog switches 4001 and 4002 may be turned on/off every one frame.

This embodiment mode may be implemented in combination with Embodiment modes 1 and 2.

Embodiment Mode 5

This embodiment mode will be described with reference to an example that a difference in luminance deterioration speed of light-emitting elements on first and second screens of a double-sided display panel is corrected by implementing multi-color display and monochrome display on the first and second screens, respectively.

Figure 6:
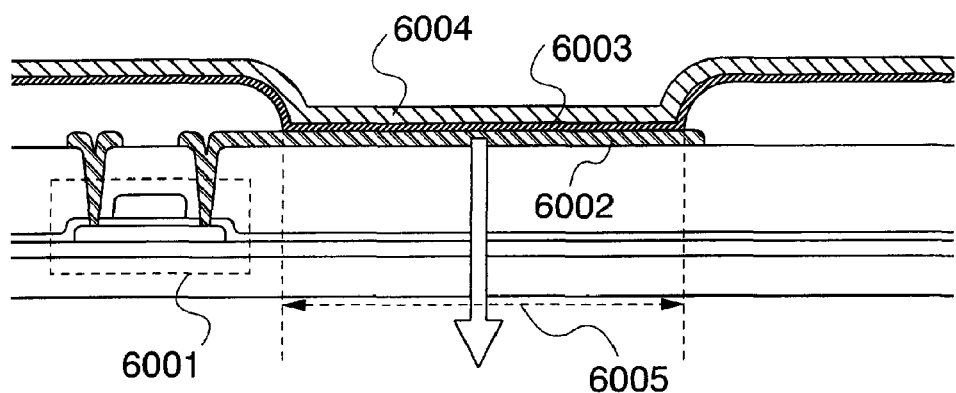
FIG. 6 is a diagram showing a section view of a pixel construction of the invention.
Figure 6:
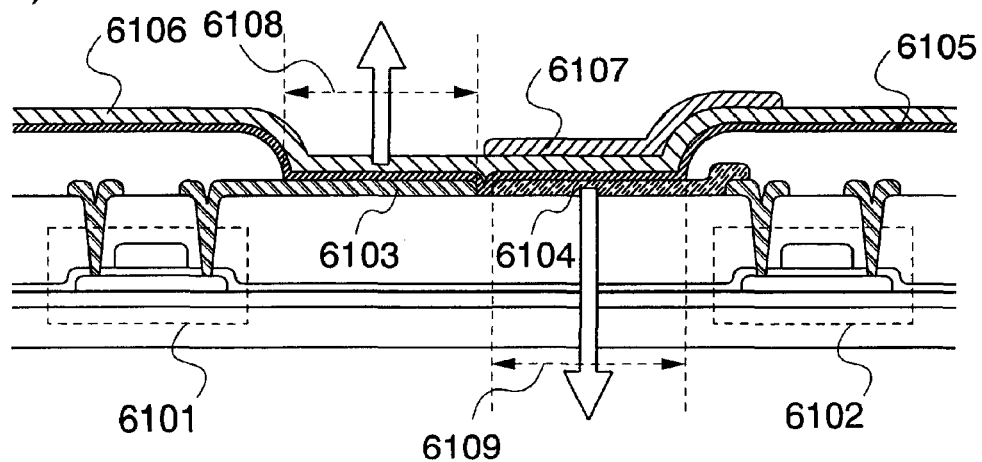

FIG. 6(A) shows a section view of one pixel of a panel example only one of the first and second screens of which emits light. FIG. 6 includes a drive TFT 6001, a pixel electrode 6002 containing a translucent material, an EL layer 6003, an opposed electrode 6004 containing a reflective material and a display area 6005.

In the display area 6005, current flows between the pixel electrode 6002 connecting to the drive TFT 6001 and the opposed electrode 6004, and the EL layer 6003 emits light thereby. In this case, since the pixel electrode 6002 contains a translucent material and the opposed electrode 6004 contains a reflective material, light is emitted from the EL layer 6003 toward the pixel electrode.

FIG. 6(B) is a diagram showing an example that the first screen and the second screen emit light. FIG. 6 includes a first drive TFT 6101, a second drive TFT 6102, a first pixel electrode 6103 containing a reflective material, a second pixel electrode 6104 containing a translucent material, an EL layer 6105, an opposed electrode 6106 containing a translucent material, a reflective film 6107 containing a reflective material, a first display area 6108 and a second display area 6109.

In the first screen 6108, current flows between the first pixel electrode 6103 connecting to the first drive TFT 6101 and the opposed electrode 6106, and the EL layer 6105 of the first display area 6108 emits light thereby. In this case, since the first pixel electrode 6103 contains a reflective material and the opposed electrode 6106 contains a translucent material, light is emitted from the EL layer 6105 toward the opposed electrode 6106 (in the direction indicated by the arrow 6110).

In the second screen 6109, current flows between the second pixel electrode 6104 connecting to the second drive TFT 6102 and the opposed electrode 6106, and the EL layer 6105 of the second display area 6109 emits light thereby. In this case, since the second pixel electrode 6104 contains a translucent material and the reflective film 6107 is provided on the opposed electrode 6106, light is emitted from the EL layer 6105 toward the second pixel electrode 6104 (in the direction indicated by the arrow 6111).

A highly reliable color element (that is, an element having a longer life) among R, G, and B elements may be only adjusted to emit light to both of the first screen 6108 and the second screen 6109 as shown in FIG. 6(B), and the other color elements may be adjusted to emit light to only one of the first screen and second screen as shown in FIG. 6(A). Thus, a difference in reliability among R, G and B elements (that is, difference in deterioration speed) may be compensated, and the first screen and second screen can implement multi-color display and monochrome display, respectively.

This embodiment mode has been described with reference to the example that multi-color display is emitted from the EL layer toward the pixel electrode while monochrome display is emitted from the EL layer to the opposed electrode. However, this embodiment mode is not limited thereto. Multi-color display may be emitted from the EL layer to the opposed electrode while monochrome display may be emitted from the EL layer toward the pixel electrode.

This embodiment mode may be implemented in combination with Embodiment Modes 1 to 3.

Embodiment Mode 6

This embodiment mode will be described with reference to an example that, in a double-sided display panel, a first screen implements multi-color display using a color filter while a second screen implements monochrome display.

Figure 7:
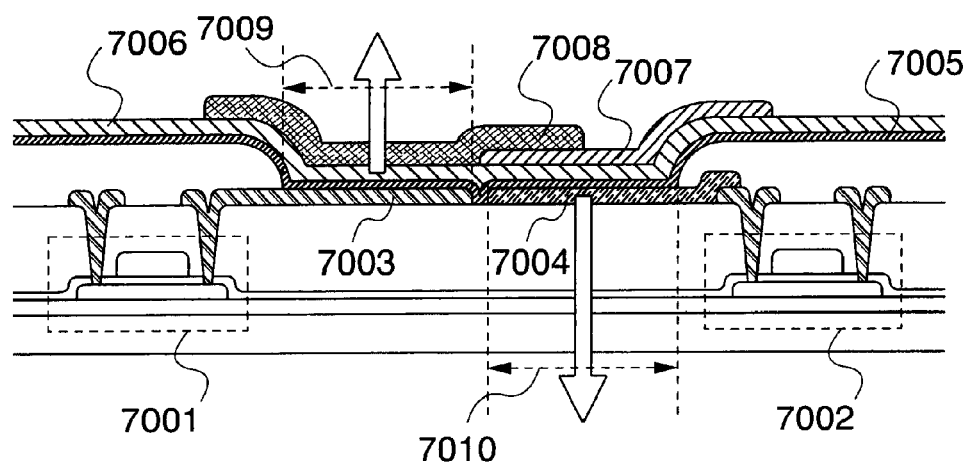
FIG. 7 is a diagram showing a section view of a pixel construction of the invention.

FIG. 7 shows a section view of a double-sided display panel according to this embodiment mode. FIG. 7 includes a first drive TFT 7001, a second drive TFT 7002, a first pixel electrode 7003 containing a reflective material, a second pixel electrode 7004 containing a translucent material, an EL layer 7005, an opposed electrode 7006 containing a translucent material, a reflective film 7007 containing a reflective material, a color filter 7008, a first display area 7009, and a second display area 7010.

In the first display area 7009, current flows between the first pixel electrode 7003 connecting to the first drive TFT 7001 and the opposed electrode 7006, and the EL layer 7005 of the first display area 7009 emits light thereby. In this case, since the first pixel electrode 7003 contains a reflective material and the opposed electrode 7006 contains a translucent material, light is emitted from the EL layer 7005 toward the opposed electrode (in the direction indicated by the arrow 7011).

In the second display area 7010, current flows between the second pixel electrode 7004 connecting to the second drive TFT 7002 and the opposed electrode 7006, and the EL layer 7005 of the second display area 7010 emits light. In this case, since the second pixel electrode 7004 contains a translucent material and the reflective film 7007 is provided on the opposed electrode 7006 in the second display area, light is emitted from the EL layer 7005 toward the second pixel electrode (in the direction indicated by the arrow 7012).

When the EL layer emits white light, the first screen implements multi-color display since a color filter is provided to the first screen. On the other hand, the second screen implements white-color display since a color filter is not provided to the second screen.

This embodiment mode can be implemented in combination with Embodiment Modes 1 to 4.

Since a light-emitting element for one color is only used in this example, the problem of the occurrence of a difference in deterioration speed among R, G and B elements can be solved.

Embodiment Mode 7

An example that manipulations are allowed even when a lid of a portable information terminal is closed will be described with reference to FIG. 1. In this case, a double-sided display panel is provided on the lid.

Generally, the notebook PC is manipulated through operation keys 1004 with the notebook PC opened (FIG. 1(A)). A touch panel is provided on a second screen 1101. Thus, even when the notebook PC is closed, manipulations are allowed through the touch panel, which is convenient for use on the move, for example.

This embodiment mode may be implemented in combination with Embodiments Mode 1 to 5.

EMBODIMENTS

Embodiment 1

Figure 8:
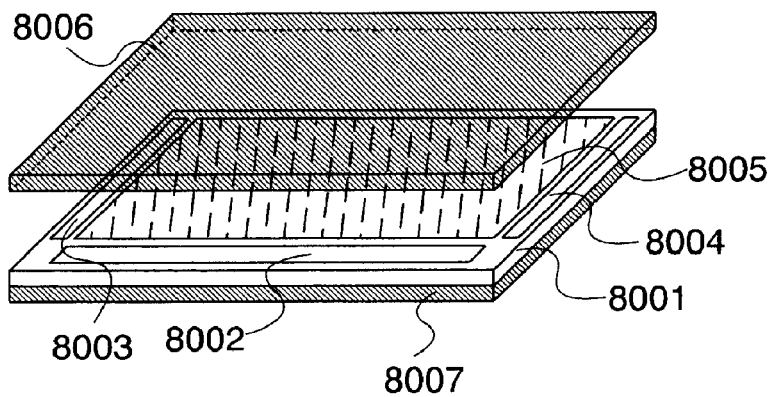
FIG. 8 is a diagram showing a combination of translucent plastic and a double-sided display panel of the invention.
Figure 8:
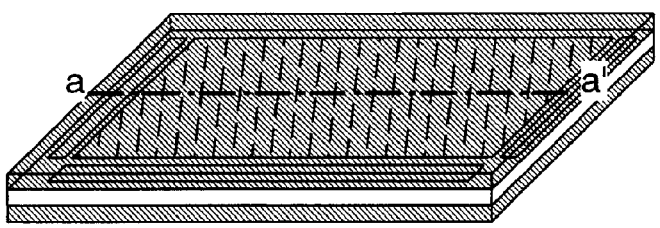
Figure 8:
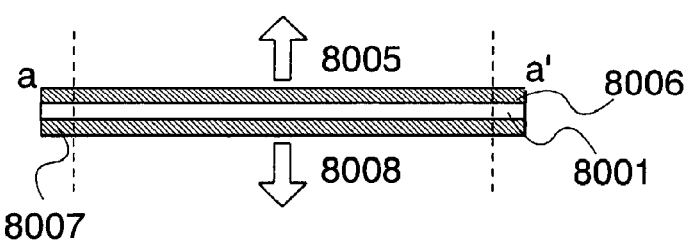
Figure 8:
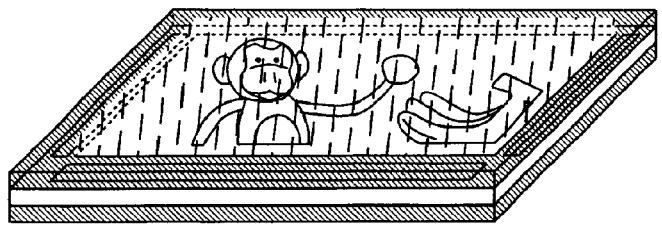

A translucent plastic placed over a double-sided display panel according to any one of embodiments of the invention will be described with reference to FIG. 8.

A double-sided display panel 8001 has a source signal line driver circuit 8002, a first gate signal line driver circuit 8003, a second gate signal line driver circuit 8004, and a first screen 8005 and second screen 8008 on the front and back, respectively.

FIG. 8(A) is a diagram showing an example that a first translucent plastic 8006 and a second translucent plastic 8007 are placed over the double-sided display panel 8001. FIG. 8(B) shows a section diagram taken at the line a-a' in the example shown in FIG. 8(A).

The first translucent plastic 8006 and the second translucent plastic 8007 desirably have a color. Thus, a pattern of the source signal line driver circuit 8002, first gate signal line driver circuit 8003, second gate signal line driver circuit 8004, first screen 8005 and second screen 8008 on the double-sided display panel 8001 is hard to see externally when images are not displayed thereon.

FIG. 8(C) shows an example that images are displayed from the double-sided display panel 8001 through the first translucent plastic 8006. In this case, when images are displayed on the first screen 8005, an EL emitted part is only isolated and is visible. The same is true for the second screen 8008 side on the back. The double-sided display panel 8001 can be protected with plastic placed thereover.

The first translucent plastic 8006 and the second translucent plastic 8007 have desirably color but may be mirror-finished.

The translucent plastic may be pasted over the double-sided display panel, or a display section formed in advance on a substrate of glass, for example, may be transferred onto the translucent plastic by a transfer technique. Alternatively, the translucent plastic may be used as a sealing substrate.

Translucent plastic may be used as a cabinet, and the entire double-sided display panel may be placed within the cabinet. Alternatively, translucent plastic may be used as a case for the double-sided display panel.

This embodiment may be implemented in combination with Embodiment Modes 1 to 6.

Embodiment 2

A display device of the invention can be used as a display section for various electronic equipment. A display device of the invention is desirably used for mobile equipment frequently used in unstable states, especially on the move.

Figure 9:
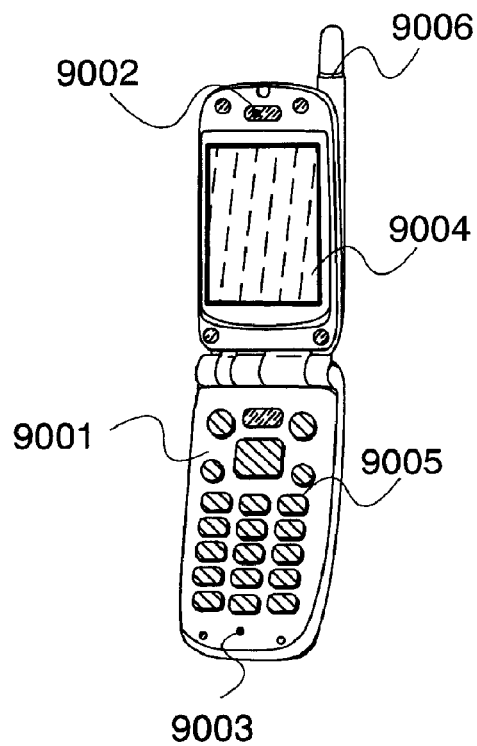
FIG. 9 is a diagram showing an electronic equipment to which a double-sided display panel of the invention is applicable.
Figure 9:
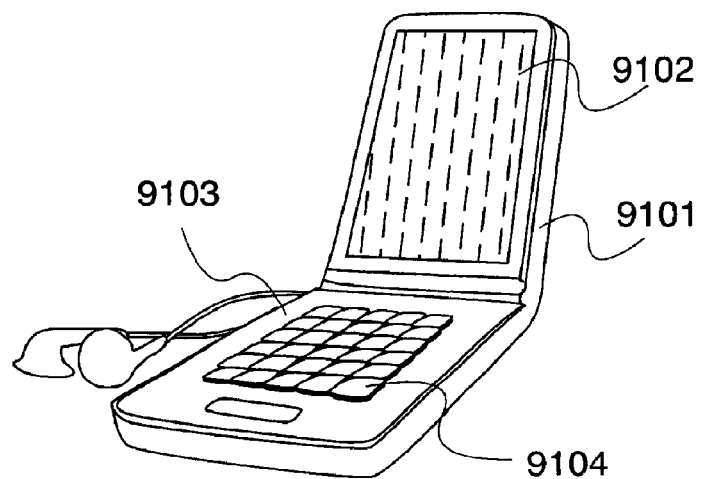

More specifically, the electronic equipment may be portable information terminal (such as mobile telephones, mobile computers, mobile game machines and electronic books), video cameras or digital cameras. A specific example of these electronic equipment is shown in FIG. 9.

FIG. 9(A) shows a mobile telephone, which includes a body 9001, a voice output section 9002, a voice input section 9003, a double-sided display panel 9004, operation switches 9005 and an antenna 9006. A display device of the invention can be used as the double-sided display panel 9004.

FIG. 9(B) shows a Personal Digital Assistant (PDA), which includes a first cabinet 9101, a double-sided display panel 9102, a second cabinet 9103, and operation switches 9104. A display device of the invention can be used as the double-sided display panel 9102.

As described above, a display device of the invention has extremely wide applications and can be used for electronic equipment in all fields.

This embodiment can be implemented in combination with Embodiment Modes 1 to 6 and Embodiment 1.

The invention provides a portable information terminal, such as a notebook PC, including EL elements entirely having longer lives and allowing lower power consumption with a double-sided display panel having first and second screens on the front and back, respectively, on a lid of the portable information terminal, such as a notebook PC. In this case, aperture ratios and light emission intensities of the first and second screens may be differentiated for different applications of the first and second screens. One of the first screen and second screen may implement multi-color display, and the other may implement monochrome display. The double-sided display panel may be used in a lid of a portable information terminal, such as a notebook PC, and a touch-panel function may be provided thereto. Thus, a portable terminal such as PC can be manipulated easily even with the lid closed. Therefore, the portable terminal can be used easily even on the move.

What is claimed is:

1. A display method for a display device comprising:
    displaying a first image with multiple pixels having respective light-emitting elements for multiple colors to implement multi-color display on a first screen on one surface of a substrate; and
    displaying a second image with one of the multiple pixels having a most reliable first light-emitting element for one of the multiple colors to implement monochrome display on a second screen on an opposite surface of the substrate to the one surface,
    wherein intensity of light emitted from the first light-emitting element is different from intensity of light emitted from a second light-emitting element provided in the one of the multiple pixels for the one of the multiple colors.

2. A display method according to claim 1 wherein the display device is one of a computer, a mobile telephone and a PDA.

3. A display method according to claim 1 wherein when current is fed to the first light-emitting element, a current supply path to the second light-emitting element is shut off.

4. A display method according to claim 1 wherein when current is fed to the second light-emitting element, a current supply path to the first light-emitting element is shut off.

5. A display method for a display device comprising:
    displaying a first image with multiple pixels having respective light-emitting elements for multiple colors to implement multi-color display on a first screen on one surface of a substrate; and
    displaying a second image with one of the multiple pixels having a most reliable first light-emitting element for one of the multiple colors to implement monochrome display on a second screen on an opposite surface of the substrate to the one surface,
    wherein an amount of current fed to the first light-emitting element is different from an amount of current fed to a second light-emitting element provided in the one of the multiple pixels for the one of the multiple colors.

6. A display method according to claim 5 wherein the display device is one of a computer, a mobile telephone and a PDA.

7. A display method according to claim 5 wherein when current is fed to the first light-emitting element, a current supply path to the second light-emitting element is shut off.

8. A display method according to claim 5 wherein when current is fed to the second light-emitting element, a current supply path to the first light-emitting element is shut off.

9. A display method for a display device comprising:
    displaying a first image with multiple pixels having respective light-emitting elements for multiple colors to implement multi-color display on a first screen on one surface of a substrate; and
    displaying a second image with one of the multiple pixels having a most reliable first light-emitting element for one of the multiple colors to implement monochrome display on a second screen on an opposite surface of the substrate to the one surface,
    wherein area of a first pixel electrode of the first light-emitting element is different from area of a second pixel electrode of a second light-emitting element provided in the one of the multiple pixels for the one of the multiple colors.

10. A display method according to claim 9 wherein the display device is one of a computer, a mobile telephone and a PDA.

11. A display method according to claim 9 wherein when current is fed to the first light-emitting element, a current supply path to the second light-emitting element is shut off.

12. A display method according to claim 9 wherein when current is fed to the second light-emitting element, a current supply path to the first light-emitting element is shut off.

13. A display method for a display device comprising:
displaying a first image with multiple pixels having respective light-emitting elements for multiple colors to implement multi-color display on a first screen on one surface of a substrate; and
displaying a second image with one of the multiple pixels having a most reliable first light-emitting element for one of the multiple colors to implement monochrome display on a second screen on an opposite surface of the substrate to the one surface,
wherein the first light-emitting element is frequently used, and a second light-emitting element provided in the one of the multiple pixels for the one of the multiple colors is infrequently used, and
wherein area of a first pixel electrode of the first light-emitting element is larger than area of a second pixel electrode of the second light-emitting element.

14. A display method according to claim 13 wherein the display device is one of a computer, a mobile telephone and a PDA.

15. A display method according to claim 13 wherein when current is fed to the first light-emitting element, a current supply path to the second light-emitting element is shut off.

16. A display method according to claim 13 wherein when current is fed to the second light-emitting element, a current supply path to the first light-emitting element is shut off.

17. A display method for a display device comprising:
displaying a first image with multiple pixels having respective light-emitting elements for multiple colors to implement multi-color display on a first screen on one surface of a substrate; and
displaying a second image with one of the multiple pixels having a most reliable first light-emitting element for one of the multiple colors to implement monochrome display on a second screen on an opposite surface of the substrate to the one surface,
wherein area of a first pixel electrode of the first light-emitting element is different from area of a second pixel electrode of a second light-emitting element provided in the one of the multiple pixels for the one of the multiple colors, and
wherein an amount of current fed to the first light-emitting element is different from an amount of current fed to the second light-emitting element.

18. A display method according to claim 17 wherein the display device is one of a computer, a mobile telephone and a PDA.

19. A display method according to claim 17 wherein when current is fed to the first light-emitting element, a current supply path to the second light-emitting element is shut off.

20. A display method according to claim 17 wherein when current is fed to the second light-emitting element, a current supply path to the first light-emitting element is shut off.

21. A display method for a display device having a double-sided display panel having a first screen on one surface of a substrate, a second screen on an opposite surface of the one surface of the substrate, and multiple pixels, each of the multiple pixels having a first light-emitting element contributing to display on the first screen and a second light-emitting element contributing to display on the second screen, wherein the first light-emitting element comprises a first pixel electrode, the second light-emitting element comprises a second pixel electrode, and the first pixel electrode and the second pixel electrode are provided in a same layer,
wherein intensities of light emitted from the first light-emitting element and the second light-emitting element are differentiated.

22. A display method according to claim 21 wherein when current is fed to the first light-emitting element, a current supply path to the second light-emitting element is shut off.

23. A display method according to claim 21 wherein when current is fed to the second light-emitting element, a current supply path to the first light-emitting element is shut off.

24. A display method for a display device having a double-sided display panel having a first screen on one surface of a substrate and a second screen on an opposite surface of the one surface of the substrate, and multiple pixels, each of the multiple pixels having a first light-emitting element contributing to display on the first screen and a second light-emitting element contributing to display on the second screen, wherein the first light-emitting element comprises a first pixel electrode, the second light-emitting element comprises a second pixel electrode, and the first pixel electrode and the second pixel electrode are provided in a same layer,
wherein luminance of light emitted from light-emitting element of a frequently used screen of the first screen and the second screen is smaller than the luminance of light emitted from light-emitting element of the other infrequently used screen.

25. A display method according to claim 24 wherein when current is fed to the first light-emitting element, a current supply path to the second light-emitting element is shut off.

26. A display method according to claim 24 wherein when current is fed to the second light-emitting element, a current supply path to the first light-emitting element is shut off.

27. A display method according to claim 24, wherein the display device is one of a computer, a mobile telephone and a PDA.

28. A display method for a display device having a double-sided display panel having a first screen on one surface of a substrate, a second screen on an opposite surface of the one surface of the substrate, and multiple pixels, each of the multiple pixels having a first light-emitting element contributing to display on the first screen and a second light-emitting element contributing to display of the second screen, wherein the first light-emitting element comprises a first pixel electrode, the second light-emitting element comprises a second pixel electrode, and the first pixel electrode and the second pixel electrode are provided in a same layer,
wherein an amount of current to be fed to the first light-emitting element is different from an amount of current to be fed to the second light-emitting element.

29. A display method according to claim 28 wherein when current is fed to the first light-emitting element, a current supply path to the second light-emitting element is shut off.

30. A display method according to claim 28 wherein when current is fed to the second light-emitting element, a current supply path to the first light-emitting element is shut off.

31. A display method according to claim 28, wherein the display device is one of a computer, a mobile telephone and a PDA.

32. A display method for a display device having a double-sided display panel having a first screen on one surface of a substrate, a second screen on an opposite surface of the one surface of the substrate and multiple pixels, each of the multiple pixels having a first light-emitting element contributing to display on the first screen and a second light-emitting element contributing to display on the second screen, wherein the first light-emitting element comprises a first pixel electrode, the second light-emitting element comprises a second pixel electrode, and the first pixel electrode and the second pixel electrode are provided in a same layer, wherein an amount of current to be fed to a light-emitting element contributing to display on a frequently used screen of the first screen and the second screen is smaller than an amount of current to be fed to a light-emitting element contributing to display on the other infrequently used screen.

33. A display method according to claim 32 wherein when current is fed to the first light-emitting element, a current supply path to the second light-emitting element is shut off.

34. A display method according to claim 32 wherein when current is fed to the second light-emitting element, a current supply path to the first light-emitting element is shut off.

35. A display method according to claim 32, wherein the display device is one of a computer, a mobile telephone and a PDA.

36. A display method for a display device having a double-sided display panel having a first screen on one surface of a substrate, a second screen on an opposite surface of the one surface of the substrate and multiple pixels, each of the multiple pixels having a first light-emitting element contributing to display on the first screen and a second light-emitting element contributing to display on the second screen, the first light-emitting element having a first pixel electrode, the second light-emitting element having a second pixel electrode, the first pixel electrode and the second pixel electrode having different areas from each other, and the first pixel electrode and the second pixel electrode being provided in a same layer, wherein an amount of current to be fed to the first light-emitting element is different from an amount of current to be fed to the second light-emitting element.

37. A display method according to claim 36 wherein when current is fed to the first light-emitting element, a current supply path to the second light-emitting element is shut off.

38. A display method according to claim 36 wherein when current is fed to the second light-emitting element, a current supply path to the first light-emitting element is shut off.

39. A display method according to claim 36, wherein the display device is one of a computer, a mobile telephone and a PDA.

40. A display method for a display device having a double-sided display panel having a first screen on one surface of a substrate, a second screen on an opposite surface of the one surface of the substrate and multiple pixels, each of the multiple pixels having a first light-emitting element contributing to display on the first screen and a second light-emitting element contributing to display of the second screen, the first light-emitting element having a first pixel electrode, and the second light-emitting element having a second pixel electrode, in which an area of the pixel electrode of a light-emitting element contributing to display on a frequently used screen of the first screen and the second screen is larger than an area of the pixel electrode of a light-emitting element contributing to display on the other infrequently used screen, and the first pixel electrode and the second pixel electrode being provided in a same layer, wherein an amount of current to be fed to the light-emitting element contributing to display on the frequently used screen of the first screen and the second screen is smaller than an amount of current to be fed to the light-emitting element contributing to display on the other infrequently used screen.

41. A display method according to claim 40 wherein when current is fed to the first light-emitting element, a current supply path to the second light-emitting element is shut off.

42. A display method according to claim 40 wherein when current is fed to the second light-emitting element, a current supply path to the first light-emitting element is shut off.

43. A display method according to claim 40, wherein the display device is one of a computer, a mobile telephone and a PDA.

44. A display method according to claim 21 wherein the first pixel electrode and the second pixel electrode comprise different materials from each other.

45. A display method according to claim 24 wherein the first pixel electrode and the second pixel electrode comprise different materials from each other.

46. A display method according to claim 28 wherein the first pixel electrode and the second pixel electrode comprise different materials from each other.

47. A display method according to claim 32 wherein the first pixel electrode and the second pixel electrode comprise different materials from each other.

48. A display method according to claim 36 wherein the first pixel electrode and the second pixel electrode comprise different materials from each other.

49. A display method according to claim 40 wherein the first pixel electrode and the second pixel electrode comprise different materials from each other.

* * * * *